(12) United States Patent  
Huang et al.

(10) Patent No.: US 8,815,703 B2  
(45) Date of Patent: Aug. 26, 2014

(54) FABRICATING METHOD OF SHALLOW TRENCH ISOLATION STRUCTURE

(71) Applicant: United Microelectronics Corporation, Hsinchu (TW)

(72) Inventors: Liang-An Huang, Tainan (TW); Yu-Chun Huang, Tainan (TW); Chin-Fu Lin, Taichung (TW); Yu-Ciao Lin, Tainan (TW); Yu-Chieh Lin, Kaohsiung (TW); Hsin-Liang Liu, Tainan (TW); Chun-Hung Cheng, Kaohsiung (TW); Yuan-Cheng Yang, Kaohsiung (TW); Yau-Kae Sheu, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 14/071,664

(22) Filed: Nov. 5, 2013

(65) Prior Publication Data

US 2014/0073109 A1   Mar. 13, 2014

Related U.S. Application Data

(62) Division of application No. 13/213,211, filed on Aug. 19, 2011, now abandoned.

(51) Int. Cl.
*H01L 21/76* (2006.01)
*H01L 21/762* (2006.01)

(52) U.S. Cl.
CPC .... *H01L 21/76224* (2013.01); *H01L 21/76232* (2013.01)
USPC .................. 438/424; 257/E21.546

(58) Field of Classification Search
CPC . H01L 21/70; H01L 21/762; H01L 21/76229; H01L 21/76232; H01L 21/76235; H01L 21/76237
USPC .................. 438/424; 257/E21.546
See application file for complete search history.

(56) References Cited

U.S. PATENT DOCUMENTS

| | | |
|---|---|---|
| 4,344,081 A | 8/1982 | Pao |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,070,381 A | 12/1991 | Scott |

(Continued)

OTHER PUBLICATIONS

Internal UMC invention disclosure document, 4 pages, confidential document.

(Continued)

*Primary Examiner* — Selim Ahmed
(74) *Attorney, Agent, or Firm* — Ding Yu Tan

(57) ABSTRACT

A fabricating method of a shallow trench isolation structure includes the following steps. Firstly, a substrate is provided, wherein a high voltage device area is defined in the substrate. Then, a first etching process is performed to partially remove the substrate, thereby forming a preliminary shallow trench in the high voltage device area. Then, a second etching process is performed to further remove the substrate corresponding to the preliminary shallow trench, thereby forming a first shallow trench in the high voltage device area. Afterwards, a dielectric material is filled in the first shallow trench, thereby forming a first shallow trench isolation structure.

6 Claims, 7 Drawing Sheets

(56) References Cited

U.S. PATENT DOCUMENTS

| | | |
|---|---|---|
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,539,238 A | 7/1996 | Malhi |
| 5,783,476 A | 7/1998 | Arnold |
| 5,811,850 A | 9/1998 | Smayling |
| 5,950,090 A | 9/1999 | Chen |
| 5,998,301 A | 12/1999 | Pham |
| 6,066,884 A | 5/2000 | Krutsick |
| 6,144,538 A | 11/2000 | Chao |
| 6,165,846 A | 12/2000 | Carns |
| 6,180,490 B1 | 1/2001 | Vassiliev |
| 6,232,202 B1 | 5/2001 | Hong |
| 6,245,689 B1 | 6/2001 | Hao |
| 6,265,752 B1 | 7/2001 | Liu |
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,391,729 B1 * | 5/2002 | Hui ........................ 438/296 |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,815,305 B2 | 11/2004 | Cha |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,927,452 B2 | 8/2005 | Shin |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,041,572 B2 | 5/2006 | Yang |
| 7,067,376 B2 | 6/2006 | Blanchard |
| 7,075,575 B2 | 7/2006 | Hynecek |
| 7,078,286 B1 | 7/2006 | Mehta |
| 7,091,079 B2 | 8/2006 | Chen |
| 7,129,559 B2 | 10/2006 | Wu |
| 7,148,540 B2 | 12/2006 | Shibib |
| 7,214,591 B2 | 5/2007 | Hsu |
| 7,244,975 B2 | 7/2007 | Chen |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 7,485,925 B2 | 2/2009 | Chen |
| 2002/0106852 A1 | 8/2002 | He |
| 2003/0022460 A1 | 1/2003 | Park |
| 2004/0018698 A1 | 1/2004 | Schmidt |
| 2004/0070050 A1 | 4/2004 | Chi |
| 2005/0014340 A1 * | 1/2005 | Kanamitsu et al. ........... 438/291 |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0081924 A1 | 4/2006 | Ichikawa |
| 2006/0138085 A1 | 6/2006 | Chien |
| 2006/0220171 A1 * | 10/2006 | Choi et al. ................... 257/500 |
| 2006/0261407 A1 | 11/2006 | Blanchard |
| 2006/0270134 A1 | 11/2006 | Lee |
| 2006/0270171 A1 | 11/2006 | Chen |
| 2007/0040212 A1 | 2/2007 | Cai |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2008/0308868 A1 | 12/2008 | Wu |
| 2009/0014810 A1 * | 1/2009 | Shin et al. ................... 257/369 |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0148250 A1 | 6/2010 | Lin |
| 2010/0213517 A1 | 8/2010 | Sonsky |

OTHER PUBLICATIONS

Internal UMC invention disclosure document, 22 pages, confidential document.

Internal UMC invention disclosure document, 7 pages, confidential document.

Donald C. D'Avanzo et al., "Effects of the Diffused Impurity Profile on the DC Characteristics of VMOS and DMOS Devices", Aug. 1977, vol. SC-12, No. 4, pp. 356-362, IEEE Journal of Solid-State Circuits.

* cited by examiner

FABRICATING METHOD OF SHALLOW TRENCH ISOLATION STRUCTURE

CROSS-REFERENCE TO RELATED APPLICATION

This is a divisional application of U.S. application Ser. No. 13/213211, filed on Aug. 19, 2011, which is currently pending. The entirety of the above-mentioned patent application is hereby incorporated by reference herein and made a part of this specification.

FIELD OF THE INVENTION

The present invention relates to a fabricating method of a shallow trench isolation structure, and more particularly to a fabricating method of a shallow trench isolation structure in the manufacture of a semiconductor device.

BACKGROUND OF THE INVENTION

Nowadays, in the mainstream of integrated circuit production, a low voltage logic circuit and a high voltage semiconductor device are implemented on the same integrated circuit chip. For providing effective isolation between adjacent electronic components, in the low voltage logic circuit and a high voltage semiconductor device, an isolation structure is usually formed in the integrated circuit chip to separate adjacent electronic components from each other. As known, a shallow trench isolation (STI) structure is one of the most popular isolation structures. Moreover, the shallow trench isolation structures of the low voltage logic circuit and the high voltage semiconductor device are simultaneously produced in the same fabricating process.

As the device size of the low voltage logic circuit is gradually developed toward miniaturization because of the process progress, the width and the depth of the shallow trench isolation structure are reduced. If the dimension of the shallow trench isolation structure of the high voltage semiconductor device is identical to the dimension of the shallow trench isolation structure of the low voltage logic circuit, the isolation efficacy of the high voltage semiconductor device is unsatisfied. Therefore, there is a need of providing an improved fabricating method of a shallow trench isolation structure.

SUMMARY OF THE INVENTION

Therefore, the object of the present invention is to provide a fabricating method of a shallow trench isolation structure in order to achieve effective isolation.

In accordance with an aspect, the present invention provides a fabricating method of a shallow trench isolation structure. Firstly, a substrate is provided, wherein a high voltage device area is defined in the substrate. Then, a first etching process is performed to partially remove the substrate, thereby forming a preliminary shallow trench in the high voltage device area. Then, a second etching process is performed to further remove the substrate corresponding to the preliminary shallow trench, thereby forming a first shallow trench in the high voltage device area. Afterwards, a dielectric material is filled in the first shallow trench, thereby forming a first shallow trench isolation structure.

In an embodiment, a low voltage device area is further defined in the substrate, and a second shallow trench is further formed in the low voltage device area by the second etching process. The first shallow trench is deeper than the second shallow trench.

In an embodiment, an inclination angle of a sidewall of the preliminary shallow trench is from 105 to 135 degrees, so that the first shallow trench has a shoulder part with a gentle slope.

In an embodiment, after the first shallow trench isolation structure is formed, the fabricating method further includes the following steps. A pre-clean process is performed to treat the shallow trench isolation structure, so that a top surface of the shallow trench isolation structure is shrunk to a location below the shoulder part. Then, a high voltage gate dielectric layer is formed on the shallow trench isolation structure and a surface of the substrate.

In an embodiment, after the preliminary shallow trench is formed, the fabricating method further includes a step of forming a spacer on a sidewall of the preliminary shallow trench, wherein the spacer is made of the same material as the dielectric material.

In an embodiment, after the preliminary shallow trench is formed and before the second etching process is done, the fabricating method further includes a step of performing an ion implantation process to dope the high voltage device area of the substrate with a dopant, so that a high voltage well region is formed in the high voltage device area.

In an embodiment, the step of filling the dielectric material in the first shallow trench includes sub-steps of performing a high density plasma chemical vapor deposition process to deposit the dielectric material, and performing a chemical mechanical polishing process to flatten the dielectric material.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A-1J are schematic cross-sectional views illustrating a process of fabricating a shallow trench isolation (STI) structure according to an embodiment of the present invention.

Figure 1A:
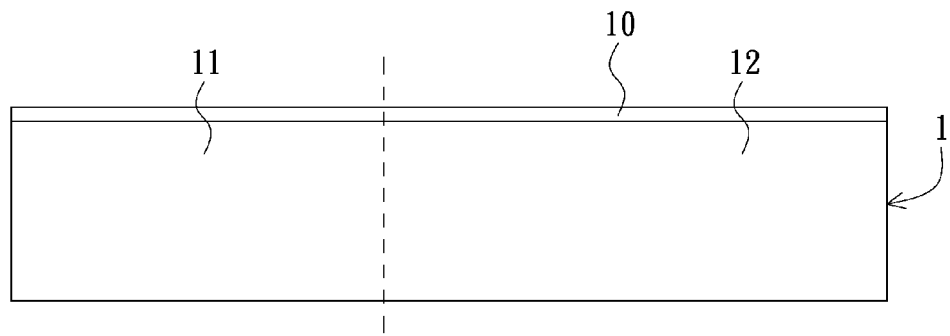
FIGS. 1A-1J are schematic cross-sectional views illustrating a process of fabricating a shallow trench isolation (STI) structure according to an embodiment of the present invention.
Figure 1B:
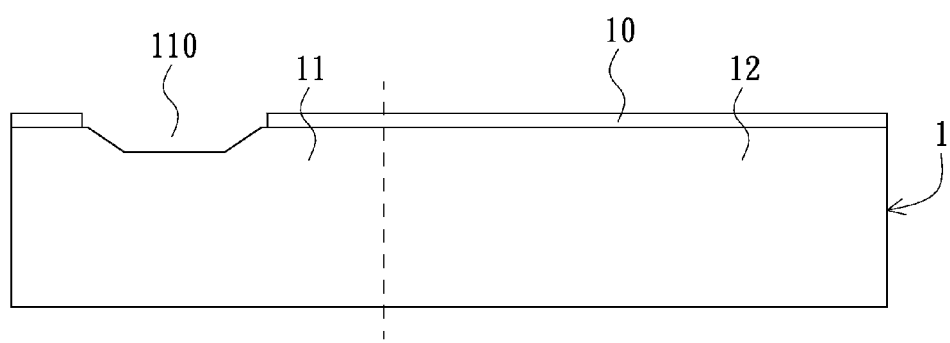

Firstly, as shown in FIG. 1A, a silicon substrate 1 is provided.

A pad oxide layer 10 is formed on a surface of the silicon substrate 1. In addition, the silicon substrate 1 is divided into two areas, i.e. a high voltage device area 11 and a low voltage device area 12.

Then, a zero-etch process is performed by using a photolithography and etching process to define an alignment mark (not shown) on the silicon substrate 1. Especially, for performing the zero-etch process, a pattern for defining a shallow trench isolation structure of the high voltage device area 11 should be previously created in the photo mask. After the zero-etch process is performed, a preliminary shallow trench 110 is formed in the high voltage device area 11 (see FIG. 1B). The preliminary shallow trench 110 has a first depth. Since the device density of the high voltage device area 11 is relatively lower, there is a sufficient space for providing a tapered preliminary shallow trench 110. That is, the sidewall of the preliminary shallow trench 110 is not upright. By adjusting the etching conditions, the sidewall of the preliminary shallow trench 110 has a gentle slope. In an embodiment, the sidewall of the preliminary shallow trench 110 has an inclination angle in a range from 105 to 135 degrees.

Figure 1C:
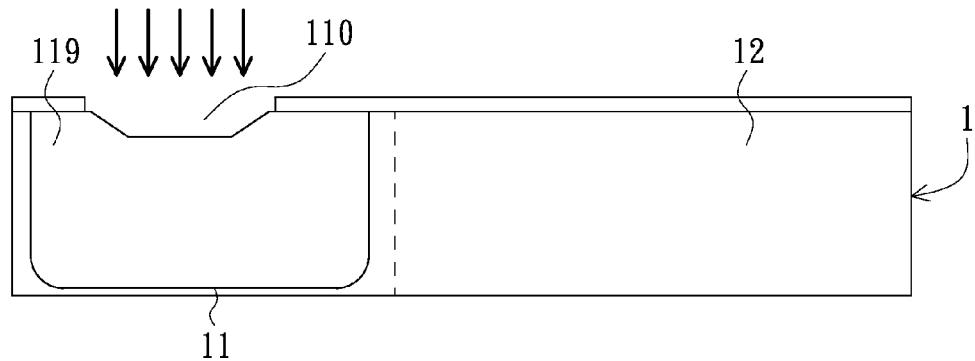

Then, as shown in FIG. 1C, an ion implantation process (as is indicated by the arrow) is performed to dope the high voltage device area 11 with a dopant. Consequently, a high voltage well region 119 is formed in the high voltage device area 11.

Figure 1D:
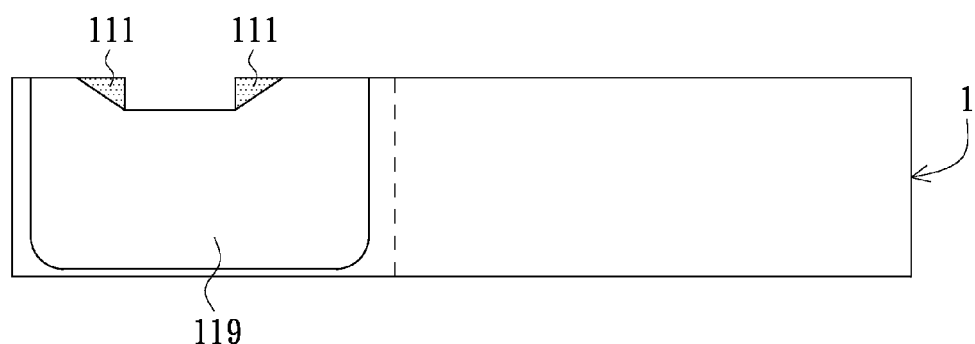

Then, as shown in FIG. 1D, a spacer 111 is formed on the sidewall of the preliminary shallow trench 110. For example, the spacer 111 is made of silicon oxide. In this embodiment, an anisotropic etching process is performed to remove the excess silicon oxide and the pad oxide layer 10 while remaining the spacer 111. By the spacer 111, the possibility of forming a residual (e.g. silicon nitride) on the sidewall of the preliminary shallow trench 110 in the subsequent process will be minimized. In other words, the spacer 111 is effective to improve the profile of the isolation structure in the subsequent process.

Figure 1E:
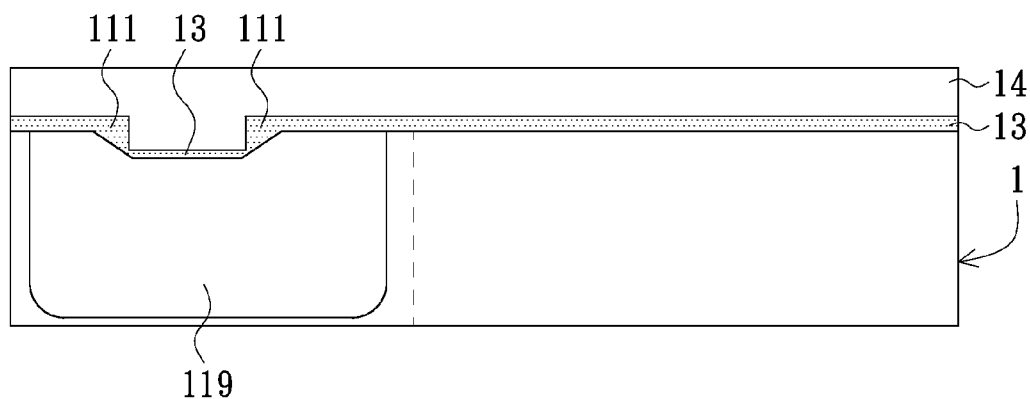
Figure 1F:
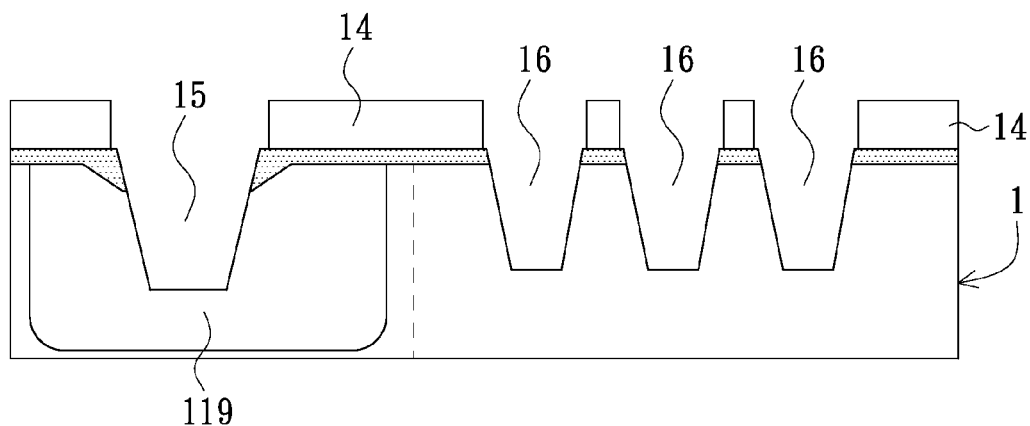
Figure 1G:
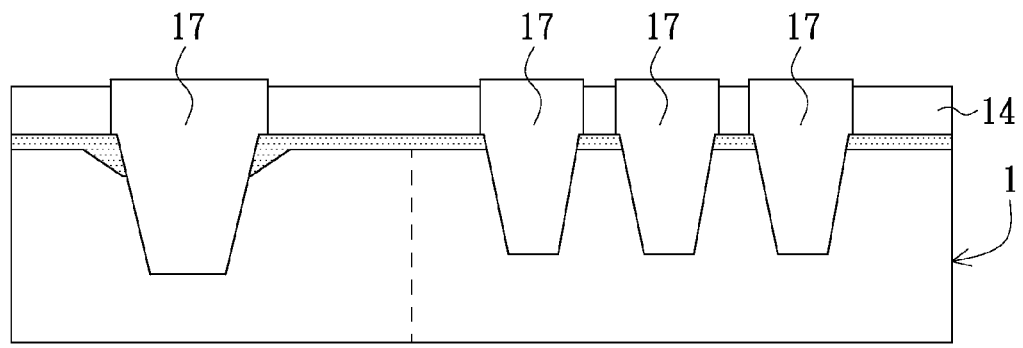

Then, as shown in FIG. 1E, a pad oxide layer 13 and a silicon nitride layer 14 are sequentially formed on the surface of the silicon substrate 1.

Then, a shallow trench etching process is performed to simultaneously form a plurality of first shallow trenches 15 and a plurality of second shallow trenches 16 in the high voltage device area 11 and the low voltage device area 12, respectively. The depth of the first shallow trench 15 in the high voltage device area 11 is greater than the depth of the second shallow trench 16 in the low voltage device area 12 (see FIG. 1F). Since the preliminary shallow trench 110 formed by the zero-etch process contributes to an upper portion of the first shallow trench 15, the first shallow trench 15 with the upper portion and a lower portion becomes deeper than the second shallow trench 16. Under this circumstance, the isolation efficacy is enhanced. In other words, the depth of the first shallow trench 15 can be adjusted through the preliminary shallow trench 110. Since the method of the present invention is capable of adjusting the depth of the shallow trench in the high voltage device area, the conventional problem will be obviated.

However, a defect is possibly formed on the silicon substrate 1 after the shallow trench etching process is performed. For repairing the defect, the silicon substrate having the shallow trenches may be treated by a high temperature furnace process (at about 100° C.). Consequently, a silicon oxide repair linear layer (not shown) is formed on the sidewalls of the shallow trenches for repairing the defect and rounding the shape corners. Under this circumstance, the electrical isolation efficacy is enhanced.

Then, a high density plasma chemical vapor deposition (HDP-CVD) process is performed, and thus a silicon oxide layer 17 is filled within the first shallow trenches 15 and the second shallow trenches 16 and formed on the silicon nitride layer 14. Then, a chemical mechanical polishing process is performed to remove the silicon oxide layer 17 overlying the silicon nitride layer 14, the top surface of the silicon oxide layer 17 is substantially at the same level as the topside of the silicon nitride layer 14 (see FIG. 1G).

Figure 1H:
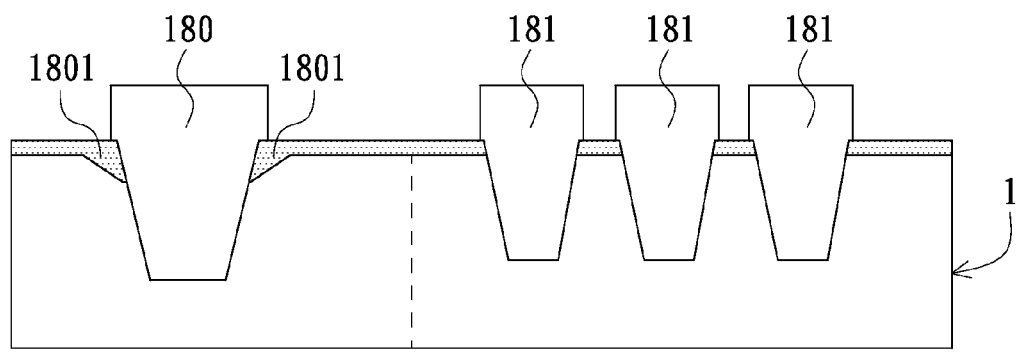

Then, as shown in FIG. 1H, an etch-back process and a nitride oxide removing process are performed to remove the silicon nitride layer 14. Consequently, a plurality of shallow trench isolation structures 180 and 181 made of silicon oxide are formed and partially exposed. The shallow trench isolation structures 180 are located at the high voltage device area 11. The shallow trench isolation structures 181 are located at the low voltage device area 12. The shallow trench isolation structure 180 is deeper than the shallow trench isolation structure 181. Moreover, the shallow trench isolation structure 180 has a shoulder part 1801 with a gentle slope.

Figure 1I:
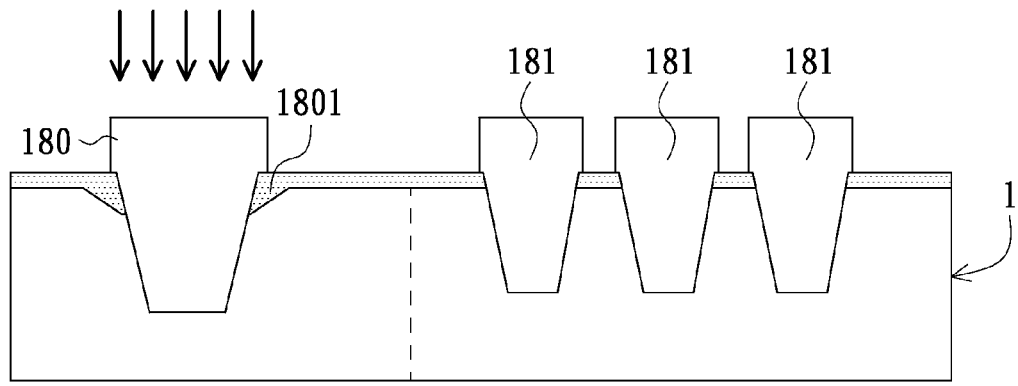
Figure 2:
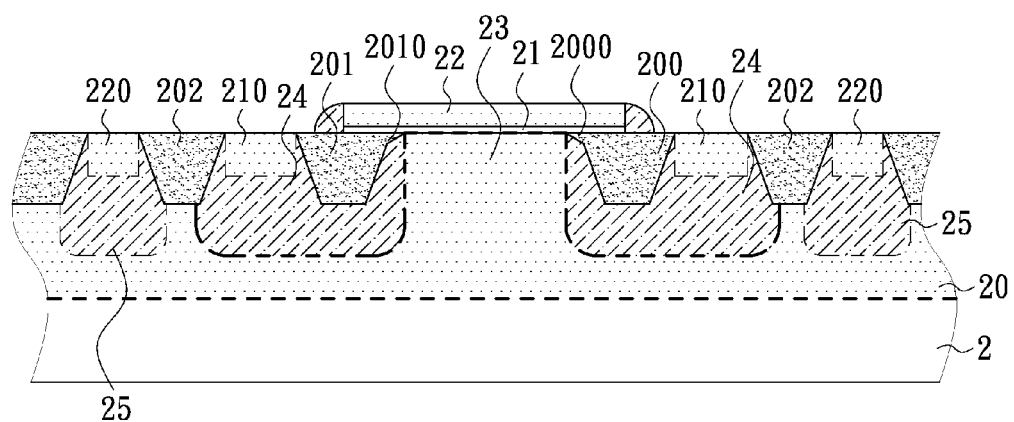
FIG. 2 is a schematic cross-sectional view illustrating a symmetric metal-oxide-semiconductor field-effect transistor with the shallow trench isolation structure produced by the method of the present invention.

Then, as shown in FIG. 1I, another ion implantation process is performed to produce other parts of the high voltage device, for example the high voltage field (HV field) region (see FIG. 2).

Figure 1J:
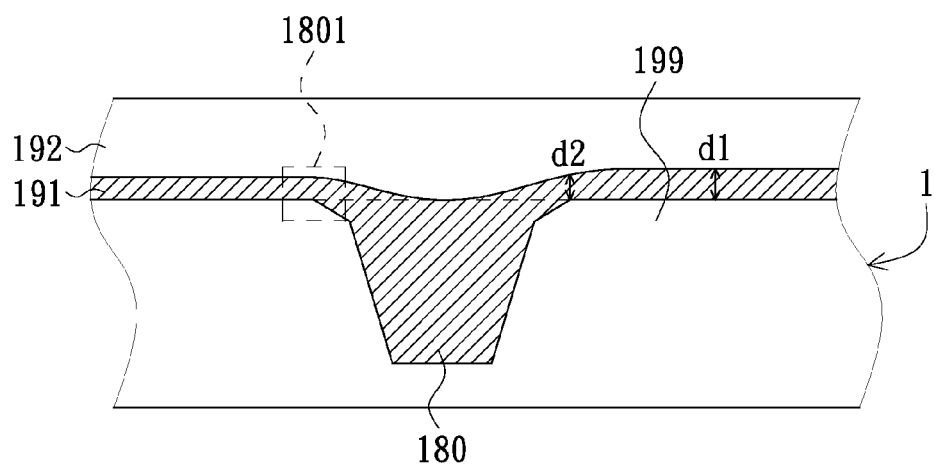

Then, as shown in FIG. 1J, one or more pre-clean processes are performed to treat the shallow trench isolation structure 180. Inevitably, the shallow trench isolation structure 180 is shrunk from the top surface to a location at a level near the shoulder part 1801. Then, a thermal oxidation process is performed, and thus a high voltage gate dielectric layer 191 is grown on the surface of the substrate 1 and the shallow trench isolation structure 180. Then, a high voltage gate conductor layer 192 is formed on the top surfaces of the high voltage gate dielectric layer 191 and the shallow trench isolation structure 180. In this embodiment, the high voltage gate dielectric layer 191 is produced by a high temperature furnace oxidation process. Moreover, the high voltage gate dielectric layer 191 is made of the same material as the shallow trench isolation structure 180. For example, the high voltage gate dielectric layer 191 is made of silicon oxide. Since the shallow trench isolation structure 180 has a shoulder part 1801 with a gentle slope, the thickness of the high voltage gate dielectric layer 191 over the shallow trench isolation structure 180 is distributed more uniformly. For example, the thickness $d1$ of the high voltage gate dielectric layer 191 overlying the channel region 199 is about 950 angstroms, and the thickness $d2$ of the high voltage gate dielectric layer 191 at the edge of the channel region 199 is about 700 angstroms. Since the ratio of $d2$ to $d1$ is maintained at a ratio greater than 0.7, the high voltage device area has enhanced insulation efficacy and is suitable to be operated in the high voltage condition.

FIG. 2 is a schematic cross-sectional view illustrating a symmetric metal-oxide-semiconductor field-effect transistor with the shallow trench isolation structure produced by the method of the present invention. Take NMOS as an example. As shown in FIG. 2, a high voltage P-well region 20 is formed in a substrate 2. A high voltage N-field region 24 and a high voltage P-field region 25 are formed in the high voltage P-well region 20. A heavily P-doped region 220 and a heavily N-doped region 210 are formed served as a body contact region and a source/drain region, respectively. Moreover, the shallow trench isolation structures 200, 201 and 202 are produced by the fabricating method of the present invention. Consequently, the metal-oxide-semiconductor field-effect transistor has enhanced insulation efficacy and is suitable to be operated in the high voltage condition. Moreover, since the thickness distribution of the high voltage gate dielectric layer 21 is more uniform, if only the single-side shoulder parts 2000 and 2010 of the shallow trench isolation structures 200 and 201 in the channel region 23 under the high voltage gate dielectric layer 21 and the high voltage gate conductor layer 22 are created, the above benefits are also achievable. Of course, if all of the shallow trench isolation structures have the shoulder parts, the benefits will become more evident.

Figure 3:
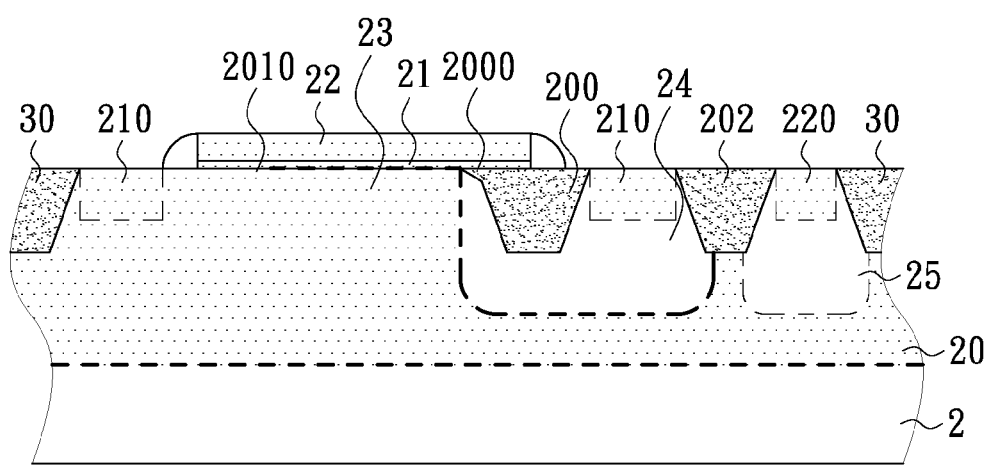
FIG. 3 is a schematic cross-sectional view illustrating an asymmetric metal-oxide-semiconductor field-effect transistor with the shallow trench isolation structure produced by the method of the present invention.

FIG. 3 is a schematic cross-sectional view illustrating an asymmetric metal-oxide-semiconductor field-effect transistor with the shallow trench isolation structure produced by the method of the present invention. In comparison with the symmetric metal-oxide-semiconductor field-effect transistor of FIG. 2, the shallow trench isolation structures 201, 202, the high voltage N-field region 24, the high voltage P-field region 25 and the heavily P-doped region 220 are not included in a side of the asymmetric metal-oxide-semiconductor field-effect transistor of FIG. 3. That is, only the heavily N-doped region 210 serving as the source/drain contact region and the outermost shallow trench isolation structure 30 are retained.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fabricating method of a shallow trench isolation structure, the fabricating method comprising steps of:
    providing a substrate, wherein a high voltage device area is defined in the substrate;
    performing a first etching process to partially remove the substrate, thereby forming a preliminary shallow trench in the high voltage device area;
    performing an ion implantation process to dope the high voltage device area of the substrate with a dopant, so that a high voltage well region is formed in the high voltage device area;
    performing a second etching process to further remove the substrate corresponding to the preliminary shallow trench, thereby forming a first shallow trench in the high voltage device area; and
    filling a dielectric material in the first shallow trench, thereby forming a first shallow trench isolation structure.

2. The fabricating method according to claim 1, wherein a low voltage device area is further defined in the substrate, and a second shallow trench is further formed in the low voltage device area by the second etching process, wherein the first shallow trench is deeper than the second shallow trench.

3. The fabricating method according to claim 1, wherein an inclination angle of a sidewall of the preliminary shallow trench is from 105 to 135 degrees, so that the first shallow trench has a shoulder part with a gentle slope.

4. The fabricating method according to claim 3, wherein after the first shallow trench isolation structure is formed, the fabricating method further comprises steps of:
    performing a pre-clean process to treat the shallow trench isolation structure, so that a top surface of the shallow trench isolation structure is shrunk to a location below the shoulder part; and
    forming a high voltage gate dielectric layer on the shallow trench isolation structure and a surface of the substrate.

5. The fabricating method according to claim 1, wherein after the preliminary shallow trench is formed, the fabricating method further comprises a step of forming a spacer on a sidewall of the preliminary shallow trench, wherein the spacer is made of the same material as the dielectric material.

6. The fabricating method according to claim 1, wherein the step of filling the dielectric material in the first shallow trench comprises sub-steps of:
    performing a high density plasma chemical vapor deposition process to deposit the dielectric material; and
    performing a chemical mechanical polishing process to flatten the dielectric material.

* * * * *